US012751022B2

(12) United States Patent
Cao

(10) Patent No.: US 12,751,022 B2
(45) Date of Patent: Sep. 29, 2026

(54) SEMICONDUCTOR DEVICE WITH MIM CAPACITOR AND METHOD FOR MANUFACTURING SAME

(71) Applicant: HANGZHOU FULLSEMI SEMICONDUCTOR CO., LTD., Hangzhou (CN)

(72) Inventor: Wenkang Cao, Hangzhou (CN)

(73) Assignee: HANGZHOU FULLSEMI SEMICONDUCTOR CO., LTD., Hangzhou City (CN)

( * ) Notice: Subject to any disclaimer, the term of this patent is extended or adjusted under 35 U.S.C. 154(b) by 691 days.

(21) Appl. No.: 17/966,744

(22) Filed: Oct. 14, 2022

(65) Prior Publication Data

US 2023/0141031 A1 May 11, 2023

(30) Foreign Application Priority Data

Nov. 10, 2021 (CN) ......................... 202111327784.5

(51) Int. Cl.

| | |
|---|---|
| ***H10D 1/68*** | (2025.01) |
| ***H01G 4/08*** | (2006.01) |
| ***H10D 1/00*** | (2025.01) |
| ***H10W 20/00*** | (2026.01) |
| ***H10W 20/40*** | (2026.01) |
| ***H10W 20/42*** | (2026.01) |

(52) U.S. Cl.

CPC ............... *H10D 1/696* (2025.01); *H01G 4/08* (2013.01); *H10D 1/041* (2025.01); *H10W 20/056* (2026.01); *H10W 20/062* (2026.01); *H10W 20/42* (2026.01); *H10W 20/496* (2026.01)

(58) Field of Classification Search

CPC .......... H10D 1/68–1/716; H10D 1/043; H01L 21/76877–76883; H10W 20/01–098; H10W 20/40–498

See application file for complete search history.

(56) References Cited

U.S. PATENT DOCUMENTS

2008/0258260 A1* 10/2008 Nagai ..................... H01L 24/11 257/532
2014/0061929 A1* 3/2014 Inaba .................... H01L 21/768 438/642
2020/0343178 A1* 10/2020 Ding ...................... H10D 1/692
2022/0302018 A1* 9/2022 Leng ........................ H10D 1/47
2022/0336577 A1* 10/2022 Leng ...................... H10D 1/042

* cited by examiner

*Primary Examiner* — Kevin Parendo
(74) *Attorney, Agent, or Firm* — IPRTOP LLC

(57) ABSTRACT

Provided are a semiconductor MIM capacitor device and a method for manufacturing the same. The method includes: providing a substrate, and sequentially forming a bottom electrode layer and a first dielectric layer over the substrate; performing patterning on the first dielectric layer by applying a first mask to form a through hole for the MIM-capacitor disposed in the MIM-capacitor region and through holes for the conductive-plugs disposed in the non-MIM-capacitor region; sequentially forming an interconnection metal layer and a second dielectric layer; performing a surface planarization treatment to remove parts of the interconnection metal layer and the second dielectric layer that are outside the through hole of MIM-capacitor and the conductive plugs; and forming an upper metal layer by applying a second mask on surfaces of the second dielectric layer of the through holes of MIM-capacitor and the conductive plugs.

10 Claims, 9 Drawing Sheets

SEMICONDUCTOR DEVICE WITH MIM CAPACITOR AND METHOD FOR MANUFACTURING SAME

TECHNICAL FIELD

The present invention generally relates to the technical field of semiconductor manufacturing, and more particularly, to a semiconductor device with an MIM capacitor and a method for manufacturing the semiconductor device.

BACKGROUND

With the rapid development of integrated circuit technology, conventional capacitor devices no longer meet the requirements of some circuits such as radio frequency circuits. Metal-insulator-metal (MIM) capacitors are a new type of capacitors, which have replaced the conventional capacitors. With the trend of shrinking device feature size and increasing device integration level, MIM capacitors have become more widely used due to their advantages including higher capacitance density, smaller capacitance-voltage coefficient, and lower leakage current. However, the manufacturing process of a MIM capacitor currently requires an additional mask, which results in cost increase.

A typical manufacturing process of a MIM capacitor currently includes at least the following steps. A substrate including a base layer 311 and a dielectric layer 312 is first provided. The substrate includes an MIM-capacitor region and a non-MIM-capacitor region thereon. A lower metal layer 32, a dielectric layer 33, and an upper metal layer 34 are then formed over the substrate sequentially, as shown in FIGS. 1-3. The lower metal layer 32 usually needs to be etched to form an isolation trench, so that a first portion of the lower metal layer 32 disposed in the MIM-capacitor region is electrically isolated from a second portion of the lower metal layer 32 disposed in the non-MIM-capacitor region, and the isolation trench will be subsequently filled with the material of the dielectric layer 33.

The upper metal layer 34 is etched using a first mask 38 as a shielding layer to remove a portion of the upper metal layer 34 disposed in the non-MIM-capacitor region. The process is generally conducted by: coating a photoresist layer 39 on the upper metal layer 34, exposing the photoresist layer 39 while the first mask 38 acts as a shielding layer, to create a desired pattern formed by remaining parts of the photoresist layer 39, then etching away a portion of the upper metal layer 34 not covered by the remaining parts of the photoresist layer 39, and then removing the remaining parts of the photoresist layer 39 to obtain a structure as shown in FIG. 4.

An interlayer dielectric layer 35 is formed to cover the MI M-capacitor region and the non-MIM-capacitor region, as shown in FIG. 5. A first through hole 351 and a second through hole 352 are formed in the interlayer dielectric layer 35 using a second mask (not shown). The first through hole 351 is disposed in the MIM-capacitor region to expose the upper metal layer 34, and the second through hole 352 is disposed in the non-MIM-capacitor region to expose the lower metal layer 32, as shown in FIG. 6.

FIG. 6 shows that the second through hole 352 penetrates the dielectric layer 33 and the interlayer dielectric layer 35; that is, the second through hole 352 will be etched deeper. The deeper the second through hole 352 is to be etched, the more difficult the etching process will be. It is more challenging to form a good bottom opening of through hole 352 than to form the through hole 352, which affects the subsequent good metal filling process. Specifically, there may be voids in the through holes left unfilled, thereby degrading the electrical performance of the device.

An interconnection metal layer 36 is formed on top of the interlayer dielectric layer 35 to fill the first through hole 351 and the second through hole 352, as shown in FIG. 7.

An isolation trench 37 is then patterned in the interconnection metal layer 36 by using a third lithography mask. The isolating trench 37 is used to electrically isolate the interconnection metal layer 36 disposed in the MIM-capacitor region and the interconnection metal layer 36 disposed in the non-MIM-capacitor region from each other, as shown in FIG. 8. An MIM capacitor 40 now includes the lower metal layer 32, the dielectric layer 33, and the upper metal layer 34.

The above process shows that there are at least three lithography masks required in this part of process for manufacturing a MIM capacitor according to the current technique existing techniques. More masks will be needed in the process, for example, lead-out electrodes are formed for connecting the MIM capacitor region and the non-MIM capacitor region respectively.

To form these lead-out electrodes, the following process can be performed. For example, an upper insulating layer 41 on top surface of the interconnection metal layer 36 can be formed over the structure obtained in the above process, and the upper insulating layer 41 is lithographically etched by using a fourth mask to form a plurality of lead-out electrode through holes disposed in the MIM-capacitor region and the non-MIM-capacitor region respectively, to expose the interconnection metal layer 36 and to perform metal filling process on the lead-out electrode through holes to form lead-out electrodes 42. A lead-out electrode metal layer 43 is formed by using a fifth mask, to electrically isolate the lead-out electrode metal layer disposed in the MIM-capacitor region and the lead-out electrode metal layer disposed in the non-MIM-capacitor region from each other, as shown in FIG. 9.

Masks used in lithography processes are customized, and critical layer masks can be expensive and may extend production cycles. Therefore, extra masks will result in higher production cost. Moreover, the lithography equipment is the most expensive and the amount of lithography equipment time is usually very limited in a semiconductor foundry fab, so that the lithography process is a bottleneck process, which restricts manufacturing capacities. Therefore, using extra masks means that a single product needs to go through plural lithography steps, which results in limited lithography process capacities and reduces the manufacturing capacities. In addition, the complexity of the operation of lithography equipment, the difficulty of lithography processes, and the fact that lithography yield greatly affects the final product yield, they all hinder further promotion and wider application of MIM capacitors.

SUMMARY

The present disclosure provides a semiconductor device with an MIM capacitor and a method for manufacturing the semiconductor device.

The method includes: providing a substrate, wherein an MIM-capacitor region and a non-MIM-capacitor region are defined over the substrate, a bottom electrode layer and a first dielectric layer are sequentially formed over the substrate, and the bottom electrode layer and the first dielectric layer are both disposed in the MIM-capacitor region and the non-MIM-capacitor region; performing patterning on the first dielectric layer by using a first mask to form through holes of MIM-capacitor and conductive-plug through holes in the first dielectric layer, wherein the through holes of MIM-capacitor are disposed in the MIM-capacitor region, the conductive-plug through holes are disposed in the non-MIM-capacitor region, and the bottom electrode layer is partially exposed by the through holes of MIM-capacitor and the conductive-plug through holes; forming an interconnection metal layer and a second dielectric layer sequentially, wherein the interconnection metal layer comprises a first portion and a second portion, the first portion of the interconnection metal layer is disposed on surfaces of the through holes of MIM-capacitor, the second portion of the interconnection metal layer fills the conductive-plug through holes to form conductive plugs, and the second dielectric layer is disposed on a surface of the interconnection metal layer; performing a surface planarization treatment to remove the interconnection metal layer and the second dielectric layer that are outside the through holes of MIM-capacitor and the conductive plugs; and forming an upper metal layer by using a second mask, wherein the upper metal layer comprises a first portion and a second portion, the first portion of the upper metal layer is disposed on a surface of the second dielectric layer, and the second portion of the upper metal layer is disposed on surfaces of the conductive plugs, wherein the MIM capacitor comprises the first portion of the interconnection metal layer, the second dielectric layer, and the first portion of the upper metal layer, wherein the first portion of the upper metal layer and the second portion of the upper metal layer are electrically isolated from each other.

Alternatively, the number of the conductive-plug through holes is at least two, and the conductive-plug through holes are formed in parallel and spaced apart.

Alternatively, the first dielectric layer comprises at least one of silicon oxide, silicon nitride, and silicon oxynitride, the second dielectric layer comprises at least one of silicon oxide, silicon nitride, aluminum oxide, tantalum oxide, yttrium oxide, hafnium silicate oxide, hafnium oxide, lanthanum oxide, and zirconium oxide, and the interconnection metal layer comprises at least one of titanium, titanium nitride, copper, and tungsten.

Alternatively, a thickness of the first dielectric layer is larger than a thickness of the second dielectric layer, wherein the conductive-plug through holes and the through holes of MIM-capacitor have top openings larger than corresponding bottom openings, wherein the conductive-plug through holes have top openings smaller than those of the through holes of MIM-capacitor.

Alternatively, forming the upper metal layer by using the second mask comprises: forming an upper metal material layer after the surface planarization treatment, wherein the upper metal material layer covers both the MIM-capacitor region and the non-MIM-capacitor region; and with the use of the second mask, performing patterning on the upper metal material layer to form the first portion of the upper metal layer on the surface of the second dielectric layer and the second portion of the upper metal layer on the surfaces of the conductive plugs, respectively.

Alternatively, after forming the upper metal layer, the method further comprises: forming a plurality of lead-out electrodes, wherein the plurality of lead-out electrodes is electrically connected with the first portion of the upper metal layer on the surface of the second dielectric layer and the second portion of the upper metal layer on the surfaces of the conductive plugs, respectively.

Alternatively, forming the plurality of lead-out electrodes comprises: forming a third dielectric layer covering both the MIM-capacitor region and the non-MIM-capacitor region; with the use of a third mask, performing patterning (photolithography and etching) on the third dielectric layer to form first lead-out electrode through holes and second lead-out electrode through holes spaced apart from each other in the third dielectric layer, wherein the first lead-out electrode through holes partially expose the first portion of the upper metal layer and the second lead-out electrode through holes partially expose the second portion of the upper metal layer; performing metal filling on the first lead-out electrode through holes and the second lead-out electrode through holes to form first lead-out electrodes and second lead-out electrodes, respectively; forming a lead-out electrode metal layer disposed on surfaces of the first lead-out electrodes and the second lead-out electrodes, wherein the lead-out electrode metal layer extends to the upper surface of the third dielectric layer; and with the use of a fourth mask, performing patterning on the lead-out electrode metal layer, so that a first portion of the lead-out electrode metal layer in the MIM-capacitor region and a second portion of the lead-out electrode metal layer in the non-MIM-capacitor region are electrically isolated from each other.

The present disclosure further provides a semiconductor device with a MIM capacitor, the semiconductor device including a substrate, a bottom electrode layer, an interconnection metal layer, a first dielectric layer, a second dielectric layer, and an upper metal layer; wherein an MIM-capacitor region and a non-MIM-capacitor region are defined over the substrate; wherein the bottom electrode layer is disposed on an upper surface of the substrate; wherein the first dielectric layer is disposed on an upper surface of the bottom electrode layer; wherein through holes of MIM-capacitor disposed in the MIM-capacitor region and conductive-plug through holes disposed in the non-MIM-capacitor region are formed in the first dielectric layer, and the bottom electrode layer is partially exposed by the through holes of MIM-capacitor and the conductive-plug through holes; wherein the interconnection metal layer comprises a first portion disposed on surfaces of the through holes of MIM-capacitor, and a second portion filling the conductive-plug through holes to form conductive plugs, wherein the first portion and the second portion of the interconnection metal layer are electrically isolated from each other; wherein the second dielectric layer is disposed on upper surfaces of the interconnection metal layer; wherein the upper metal layer is disposed on a surface of the second dielectric layer and on surfaces of the conductive plugs, wherein the upper metal layer comprises a first portion disposed on the surface of the second dielectric layer and a second portion disposed on the surfaces of the conductive plugs, wherein the first portion and the second portion of the upper metal layer are electrically isolated from each other; wherein the MIM capacitor comprises the interconnection metal layer, the second dielectric layer, and the first portion of the upper metal layer.

Alternatively, the conductive plugs are plural, and the conductive plugs partially extend into the bottom electrode layer.

Alternatively, the semiconductor device further includes first lead-out electrodes and second lead-out electrodes spaced apart from each other, wherein the first lead-out electrodes are electrically connected to the MIM capacitor, and the second lead-out electrodes are electrically connected to the conductive plugs.

DETAILED DESCRIPTION

Figure 1:
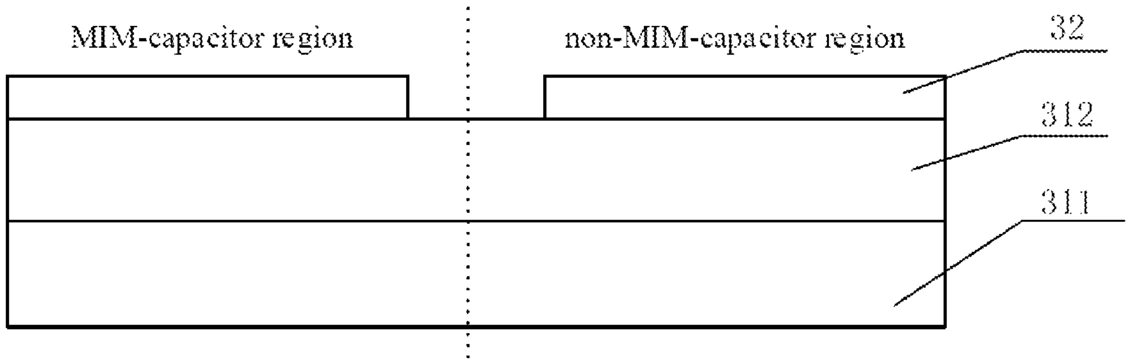
FIG. 1 (prior art)
FIGS. 1-9 are schematic cross-sectional views of intermediate structures obtained in various steps in the process of manufacturing an MIM capacitor according to the current techniques.
Figure 2:
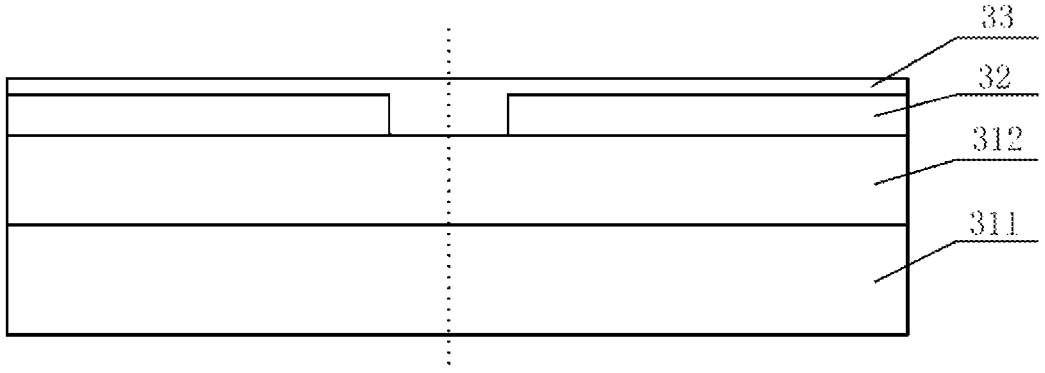
FIG. 2 (prior art)
Figure 3:
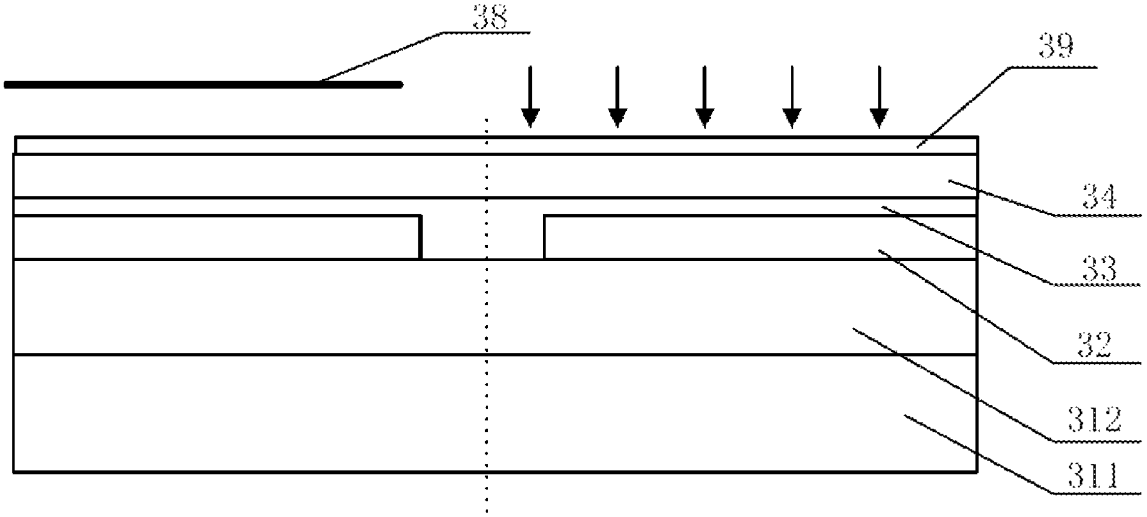
FIG. 3 (prior art)
Figure 4:
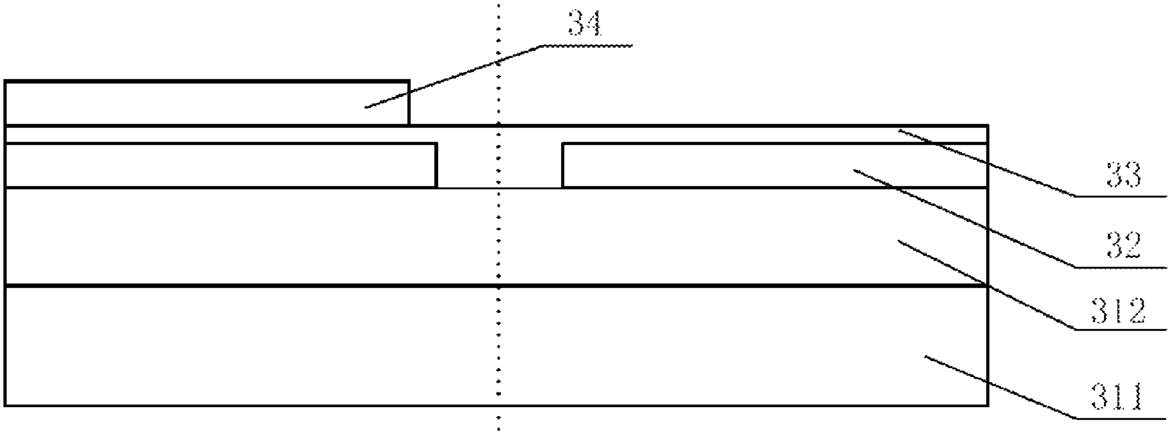
FIG. 4 (prior art)
Figure 5:
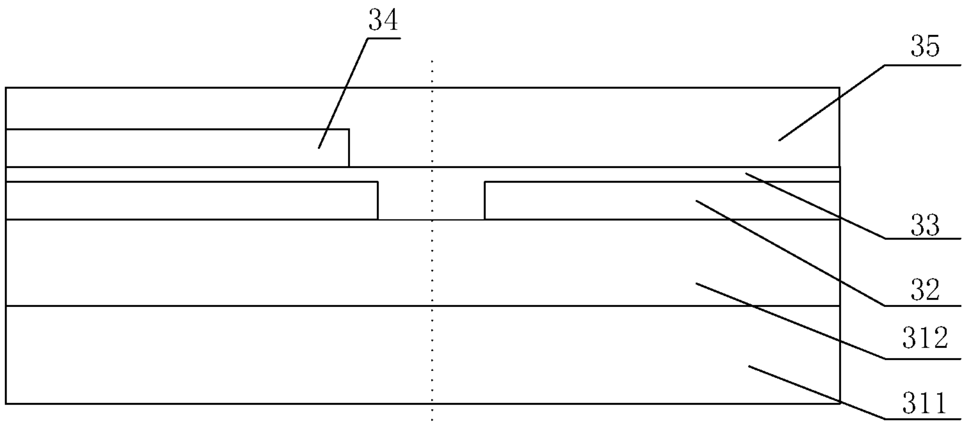
FIG. 5 (prior art)
Figure 6:
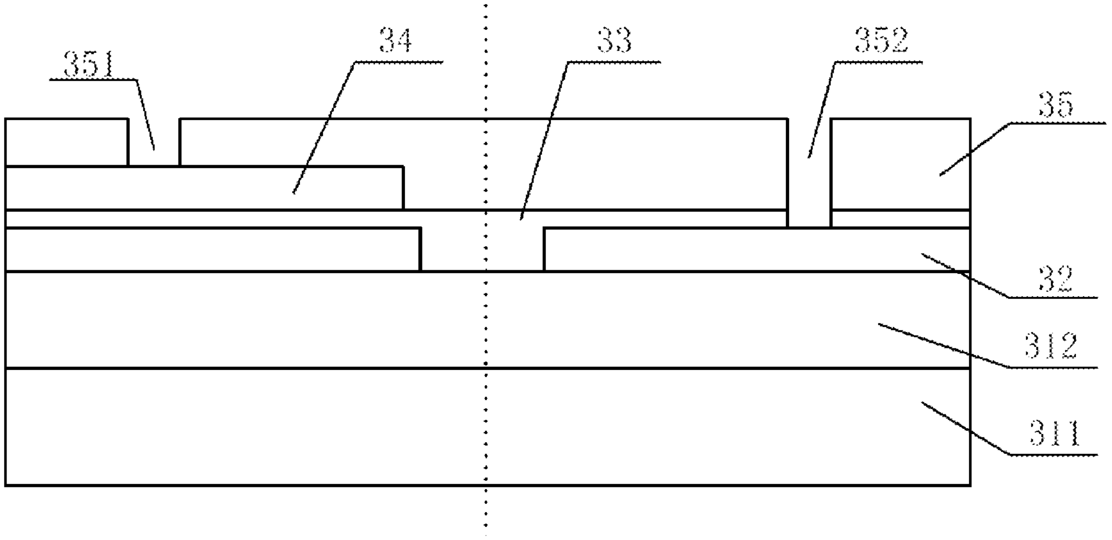
FIG. 6 (prior art)
Figure 7:
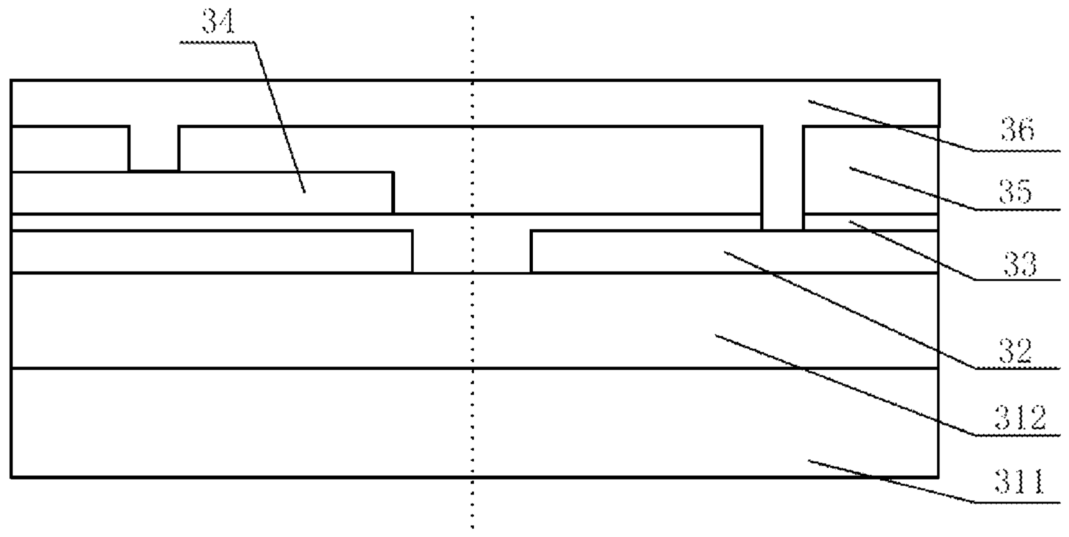
FIG. 7 (prior art)
Figure 8:
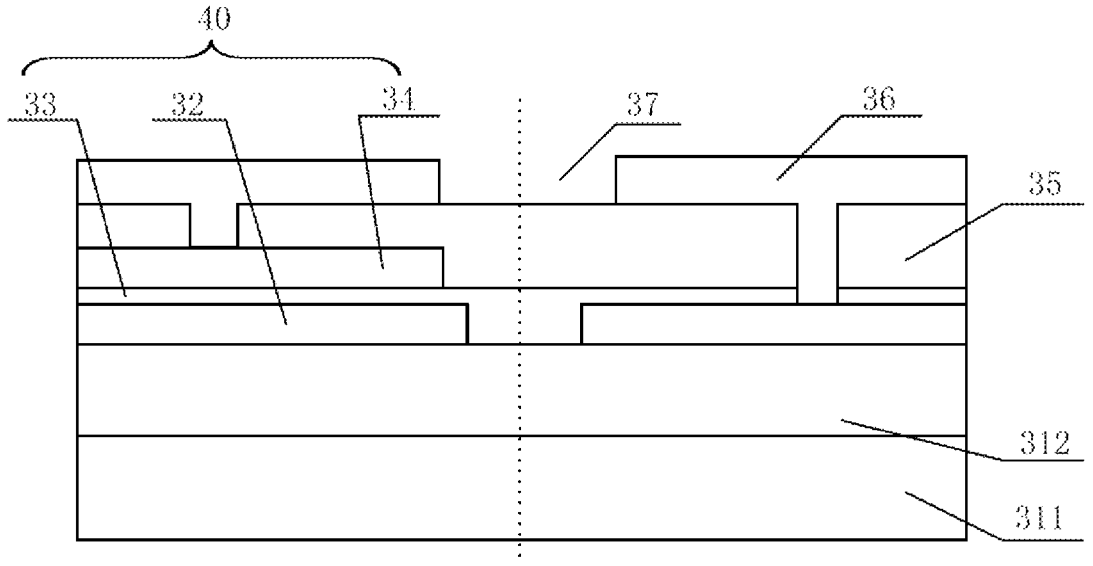
FIG. 8 (prior art)
Figure 9:
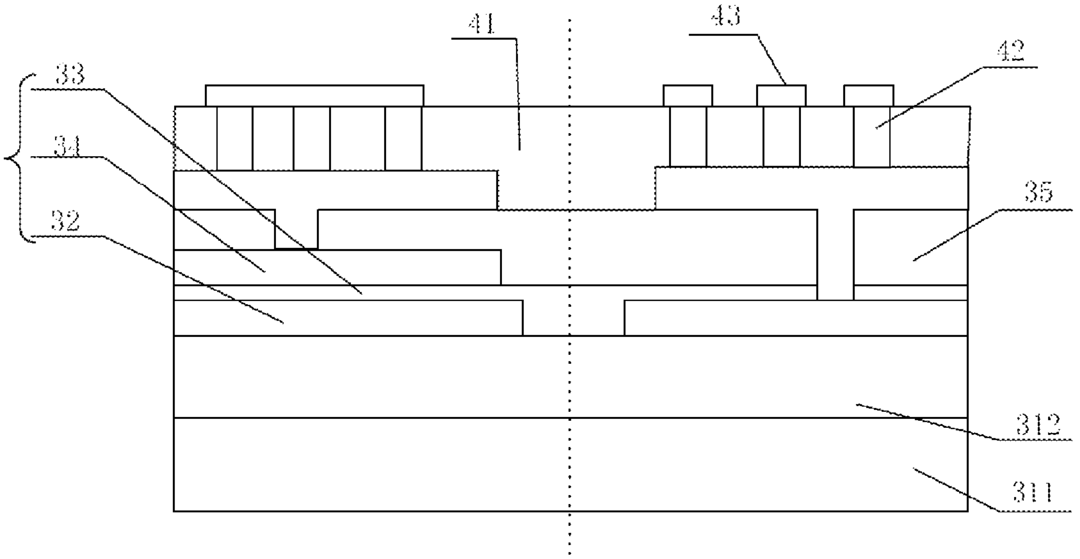
FIG. 9 (prior art)

The embodiments of the present invention are described below through specific examples, and those skilled in the art can easily understand other advantages and effects of the present invention from the contents disclosed in this specification. The present disclosure can also be implemented or applied through other different embodiments, and various details in this specification can also be modified or changed based on different viewpoints and applications without departing from the spirit of the present disclosure. For example, when describing the embodiments of the present disclosure in detail, for the convenience of description, the cross-sectional views are not necessarily drawn to scale, and the schematic diagrams are only exemplary, which should not limit the scope of the present disclosure. In addition, the three dimensions such as length, width and depth should be included in the actual implementations.

For the convenience of description, terms regarding spatial relationships such as “below”, “lower”, “under”, “bottom”, “above”, “on”, etc. may be used herein to describe the relationship between an element or a feature and other elements or features shown in the figures. It will be understood that these terms are intended to encompass other directions of the device in use or in operation than those depicted in the figures. In addition, when a layer is referred to as being “between” two layers, it can be the only layer between the two layers, or one or more intervening layers may also be present.

In the context of this application, when a first feature is “on” a second feature, the first and second features may be formed in direct contact, and there may also be additional features formed between the first and second features.

It should be noted that the drawings provided with the embodiments are only to illustrate the basic concept of the present disclosure in a schematic way, thus the drawings only show the elements closely related to the present disclosure and do not necessarily conform to the numbers, shapes, and sizes of the elements in actual implementation. In actual implementation, the type, quantity, and shape of each element can be changed as needed and the layout of the elements may also be more complicated. In order to make the drawings as concise as possible, not all structures are labeled in the drawings.

In the current technique existing technique, when manufacturing an MIM capacitor, at least three masks are required, which leads to increased production cost and decreased production efficiency.

As shown in FIGS. 9-18, the present disclosure provides a method for manufacturing a semiconductor MIM capacitor device. The method (as shown in the flow chart of FIG. 18) includes steps S1-S5.

Figure 10:
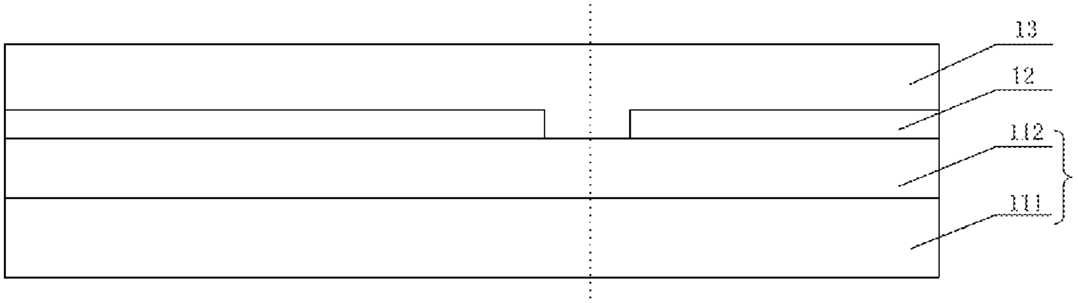
FIGS. 10-17 are schematic cross-sectional views of intermediate structures obtained in various steps of a method for manufacturing a semiconductor MIM capacitor device according to an embodiment of the present disclosure.

In Step S1, a substrate 11 is provided, on which an MIM-capacitor region and a non-MIM-capacitor region are defined. A bottom electrode layer 12 and a first dielectric layer 13 are sequentially formed over the substrate 11. The bottom electrode layer 12 and the first dielectric layer 13 are both disposed in the MIM-capacitor region and the non-MIM-capacitor region. In other words, the bottom electrode layer 12 and the first dielectric layer 13 are disposed on the substrate 11. In an embodiment, the MIM-capacitor region and the non-MIM-capacitor region are designed to be adjacent to each other. In an embodiment, the MIM-capacitor region is for functional devices such as MIM capacitors, and the non-MIM-capacitor region is for peripheral circuits not including MIM capacitors. The MIM-capacitor region and the non-MIM-capacitor region can also be arranged spaced apart with a transition region therebetween. The substrate 11 may be a single-layer structure, or may be a multi-layer structure as shown in the figures, including, for example, a base layer 111 and an interlayer dielectric layer 112 disposed on a surface of the base layer 111. The base layer 111 includes, but is not limited to, a semiconductor substrate such as a silicon substrate, a germanium substrate, a silicon-germanium substrate, a sapphire substrate, or a silicon-on-insulator (SOI) substrate. The interlayer dielectric layer 112 includes, but is not limited to, a silicon oxide layer, a silicon nitride layers, a silicon oxynitride layer, or any other insulating layer. The interlayer dielectric layer 112 may be formed by vapor deposition. The material of the bottom electrode layer 12 includes, but is not limited to, at least one of copper, aluminum, and metal silicide. The bottom electrode layer 12 may be formed by physical vapor deposition. A first portion of the bottom electrode layer 12 is in the MIM-capacitor region, and a second portion of the bottom electrode layer 12 is in the non-MIM-capacitor region, and the two portions are electrically isolated by, for example, an isolation trench (which can be filled by the first dielectric layer 13). The first dielectric layer 13 includes, but is not limited to, at least one of silicon oxide, silicon nitride, and silicon oxynitride. The first dielectric layer 13 may be formed by vapor deposition. The thickness of each layer or element can be determined according to actual requirements of the device. For example, the thickness of the bottom electrode layer 12 can be in the range of 200 nm-1000 nm. (In this specification, when the description of a numerical range is involved, the corresponding endpoint values are included unless otherwise specified). The thickness of the first dielectric layer 13 can be in the range of 500 nm-5000 nm, preferably in the range of 2000 nm-3000 nm, to ensure that through holes of MIM-capacitor 131 subsequently obtained through etching have a certain depth and that the through holes 131 will not be completely filled with the metal so that the filled through holes are still in the shape of multiple recesses. The intermediate structure obtained after this step is shown in FIG. 10 (not shown the shape of multiple recesses).

Figure 11:
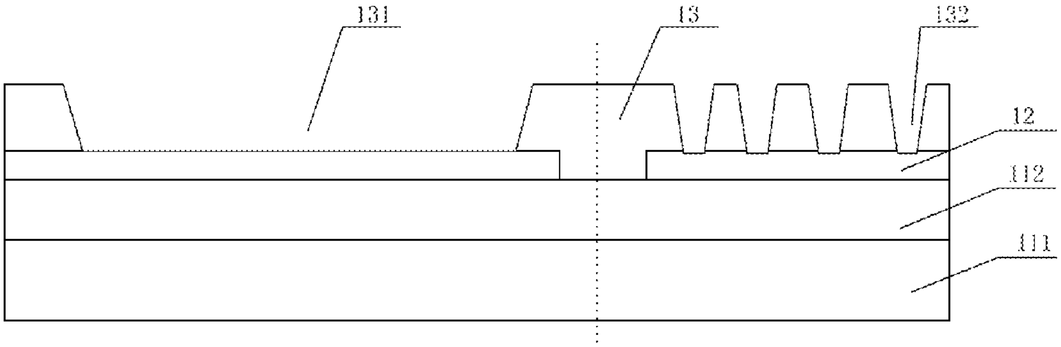

In Step S2, with the use of a first mask (not shown), photolithography plus etching is performed on the first dielectric layer 13 so as to form through holes of MIM-capacitor 131 and conductive-plug through holes 132 in the first dielectric layer 13. The through holes of MIM-capacitor 131 are disposed in the MIM-capacitor region, and the conductive-plug through holes 132 are disposed in the non-MIM-capacitor region, so that the bottom electrode layer 12 is partially exposed by the through holes of MIM-capacitor 131 and by the conductive-plug through holes 132. Specifically, the step of performing photolithography plus etching on the dielectric layer 13 using the first mask may include: forming a photoresist layer on the surface of the first dielectric layer 13; with the use of the first mask, exposing and developing the photoresist layer to obtain a desired pattern formed by the remaining photoresist layer; performing dry or wet etching on the first dielectric layer 13 according to the pattern to form the through holes of MIM-capacitor 131 and the conductive-plug through holes 132; and finally removing any residual photoresist layer. The number of the through holes of MIM-capacitor 131 is one or more. In one embodiment, there is only one MIM-capacitor through hole. The number of the conductive-plug through holes 132 is one or more. When the number of the conductive-plug through holes 132 is larger than two, the conductive-plug through holes 132 are distributed in parallel and spaced apart. In one preferred embodiment, the through holes of MIM-capacitor 131 and the conductive-plug through holes 132 both have top openings larger than corresponding bottom openings, that is, some of their cross sections are trapezoidal in shape, with a wider top and a narrower bottom, which facilitates subsequent metal filling. The depths of the through holes of MIM-capacitor 131 and the conductive-plug through holes 132 may be the same or different. For example, the conductive-plug through holes 132 may slightly extend into the bottom electrode layer 12, which helps to ensure electrical connections of the device. As an example, the size of the through holes of MIM-capacitor 131 is generally larger than the size of the conductive-plug through holes 132. Generally, the top openings of the former are larger than those of the latter, and the bottom openings of the former are larger than those of the latter. The intermediate structure obtained after this step is shown in FIG. 11.

Figure 12:
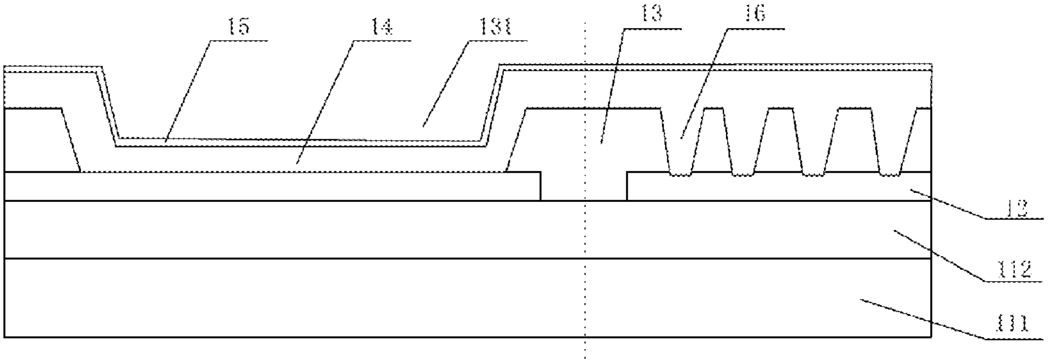

In Step S3, an interconnection metal layer 14 and a second dielectric layer 15 are sequentially formed. The interconnection metal layer 14 is disposed on surfaces of the through holes of MIM-capacitor 131 (but it does not completely fill the through holes 131 in the MIM-capacitor region, so as to ensure that there is a recess with height difference between the top and the bottom of the through holes 131 of the MIM-capacitor region to form the recess structure.) The conductive-plug through holes 132 are filled by the interconnection metal layer 14 to form conductive plugs made of the interconnection metal layer 14 in the conductive-plug through holes 132. The second dielectric layer 15 is disposed on a surface of the interconnection metal layer 14. As an example, the forming material of the interconnection metal layer 14 includes, but is not limited to, at least one of titanium, titanium nitride, copper and tungsten, and the forming technique of the interconnection metal layer 14 includes, but is not limited to, sputtering. At least part of the interconnection metal layer 14 has a thickness greater than the thickness of the first dielectric layer 13 to ensure that the interconnection metal layer 14 can extend over the top of the first dielectric layer 13 after the interconnection metal layer 14 fills the through holes of MIM-capacitor 131 and the conductive-plug through holes 132. As an example, the second dielectric layer 15 includes, but is not limited to, at least one of silicon oxide, silicon nitride, and a combination thereof. A high-K dielectric material can also be used, such as aluminum oxide, tantalum oxide, yttrium oxide, hafnium silicate oxide, hafnium oxide, lanthanum oxide, and zirconium oxide. The second dielectric layer 15 may be formed by vapor deposition to have a thickness of 200 nm-500 nm. The intermediate structure obtained after this step is shown in FIG. 12.

Figure 13:
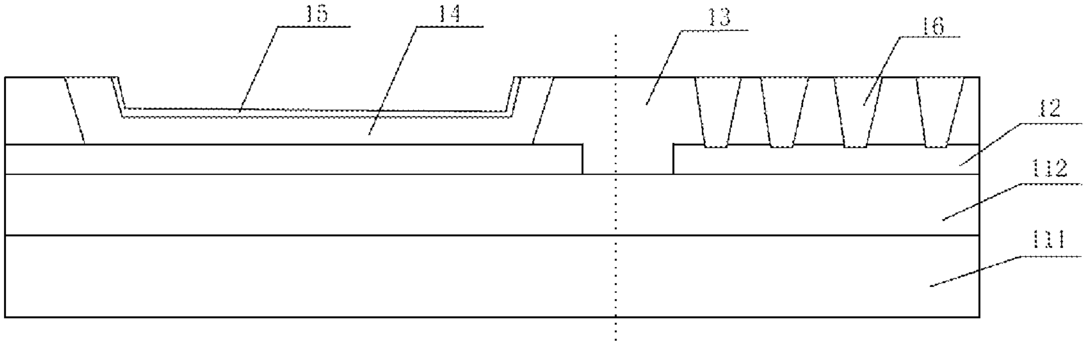

In Step S4, a surface planarization treatment including, but not limited to, chemical mechanical polishing (CMP), is performed to remove the interconnection metal layer 14 and the second dielectric layer 15 outside the through holes of MIM-capacitor 131 and the conductive plugs 16 to retain only the interconnection metal layer 14 and the second dielectric layer 15 disposed on the inner surface of the MIM capacitor through hole 131 and the interconnection metal layer 14 disposed in the conductive-plug through holes 132, so that the upper surfaces of the conductive plugs 16 and the upper surface of the first dielectric layer 13 are at the same level. After the planarization treatment, there is a height difference between the bottom of the through holes of MIM-capacitor 131 and the upper surface of the device (for example, that is the upper surface of the first dielectric layer 13). The intermediate structure obtained after this step is shown in FIG. 13.

Figure 14:
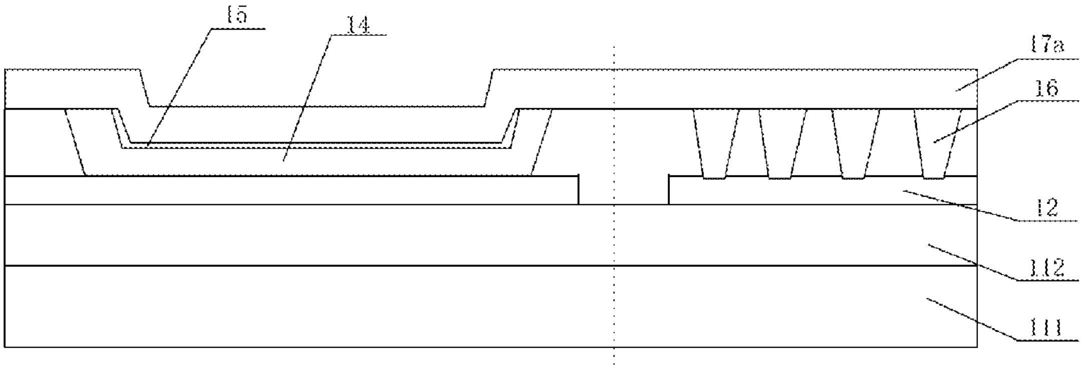

In Step S5, with the use of a second mask, an upper metal layer 17 is formed on the surfaces of the second dielectric layer 15 of the through holes of MIM-capacitor 131 and on the surfaces of the conductive plugs 16, so that at least one MIM capacitor 18 is formed by the interconnection metal layer 14 disposed in the through holes of MIM-capacitor 131, the second dielectric layer 15, and the upper metal layers 17. The upper metal layer 17 includes a first portion in the MIM capacitor 18 recess area and a second portion on the surfaces of the conductive plugs 16, and the two portions are electrically isolated from each other. In one embodiment, the step of forming the upper metal layer 17 may include: after the surface planarization treatment, first forming an upper metal material layer 17*a* by, physical vapor deposition, wherein the upper metal material layer 17*a* covers both the MIM-capacitor region and the non-MIM-capacitor region. That is, a first portion of the upper metal material layer 17*a* in the MIM-capacitor region and a first portion of the upper metal material layer 17*a* in the non-MIM-capacitor region are formed in the same process and are connected to each other. The material of the upper metal material layer 17*a* may be the same as or different from the material of the interconnection metal layer 14. Such material includes, but not limited to, at least one of titanium, titanium nitride, copper and tungsten. The upper metal material layer 17*a* may also be made of the same material as the bottom electrode layer 12. The intermediate structure obtained after this step is shown in FIG. 14.

Figure 15:
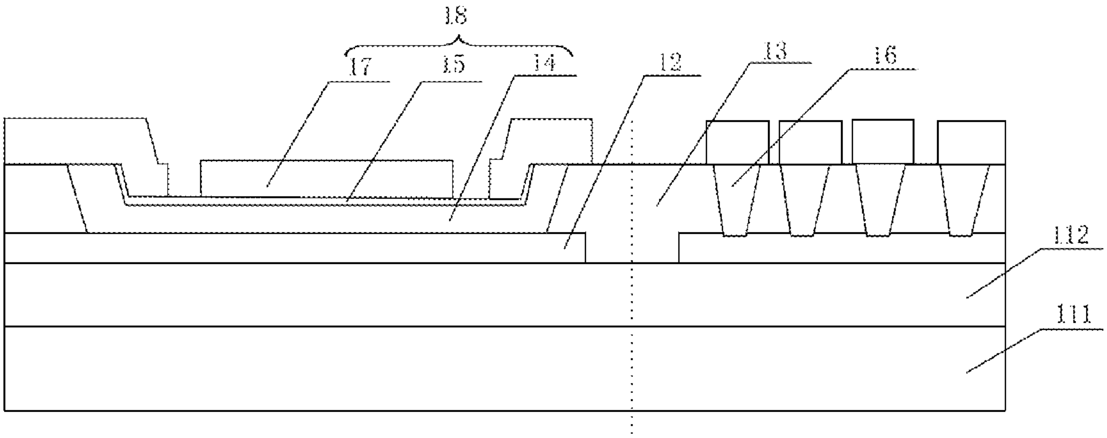

With the use of the second mask, photolithographic patterning is performed on the upper metal material layer 17*a* to form an isolation trench between the first portion of the upper metal material layer 17*a* in the MIM-capacitor region and the second portion of the upper metal material layer 17*a* in the non-MIM-capacitor region, so that the two portions are separated from each other. When there are multiple conductive plugs 16, the second portion of the upper metal layer 17 on the surfaces of different conductive plugs 16 are further divided into smaller portions corresponding to the conductive plugs, and the smaller portions are electrically isolated from each other. The structure obtained after this step is shown in FIG. 15. So far, the manufacturing of the MIM capacitor 18 in one embodiment has completed.

It can be seen from the above that the present disclosure optimizes the process by adopting through holes (e.g., through holes of MIM-capacitor) to provide recessed structures. During the surface planarization treatment performed on the interconnection metal layer, conductive metals at the bottom will not be removed and can be used as the MIM capacitor's lower plate, the upper metal layer is used as the upper plate, and the two along with the dielectric layer between the lower metal layer and the upper metal layer, form an MIM capacitor. Compared with the current technique, the present disclosure can effectively reduce mask usage, which helps to reduce the cost. In addition, using only two masks means only two photolithography processes are required, which improves the production efficiency of the photolithography equipment. At the same time, the photolithography processes are simplified, so that the difficulty of the overall process is overcome, which helps to improve the product yield. For the semiconductor device manufactured according to the present disclosure, only a single dielectric layer needs to be etched when forming conductive-plug through holes in the non-MIM-capacitor region by etching, which helps to ensure that the conductive-plug through holes are indeed through holes, so that generation of voids after the subsequent filling with the interconnect metal material can be prevented, which helps to improve the electrical performance of the device.

As an example, in order to electrically lead out the device, the method further includes forming a plurality of lead-out electrodes after the formation of the upper metal layer 17. The lead-out electrodes are electrically connected with the first portion of the upper metal layer 17 on the surface of the second dielectric layer 15 and the second portion of the upper metal layer 17 on the surfaces of the conductive plugs 16, respectively. In an embodiment, the method of forming the plurality of lead-out electrodes includes steps described below.

Figure 16:
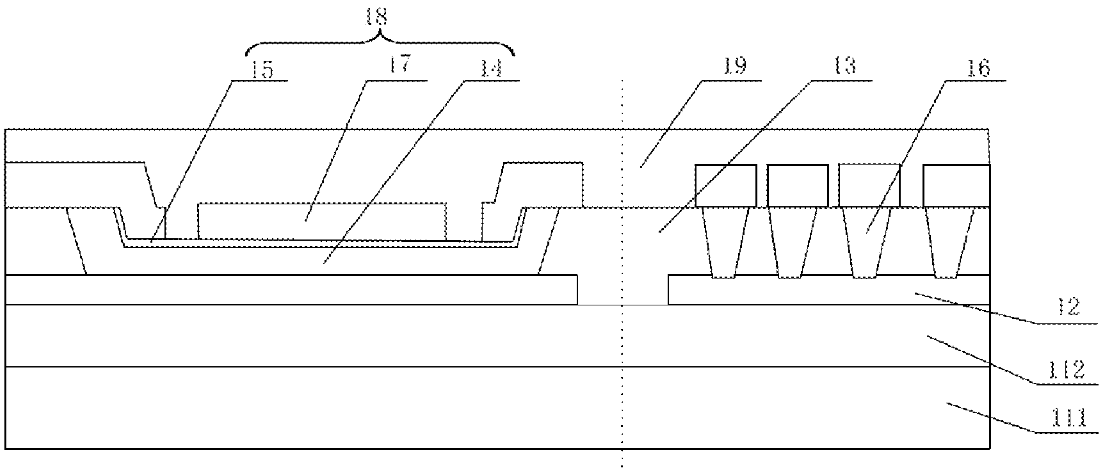

A third dielectric layer 19 is formed, and the third dielectric layer 19 covers the MIM-capacitor region and the non-MIM-capacitor region. The third dielectric layer 19 can be made of a material the same as or different from the first dielectric layer 13, and such material includes, but not limited to, at least one of silicon nitride, silicon oxide, silicon oxynitride, and any other insulating material. The third dielectric layer 19 is formed by, for example, vapor deposition. After the third dielectric layer 19 is formed, it is subjected to chemical mechanical polishing, so that its upper surface is flat. The upper surface of the third dielectric layer 19 after polishing has a certain distance from the second portion of the upper metal layer 17 on the conductive plugs 16. The structure obtained after this step is shown in FIG. 16.

With the use of a third mask, photolithography and etching is performed on the third dielectric layer 19 to form first lead-out-electrode through holes and second lead-out-electrode through holes spaced apart from each other in the third dielectric layer 19. The first lead-out-electrode through holes partially expose the first portion of the upper metal layer 17 and the second lead-out-electrode through holes partially expose the second portion of the upper metal layer 17 on the conductive plugs 16. Both the number of first lead-out-electrode through holes and the number of second lead-out-electrode through holes can be one or more.

Metal materials are filled in the first lead-out-electrode through holes and the second lead-out-electrode through holes to form first lead-out electrodes 20 and second lead-out electrodes 21, respectively, by, for example, sputtering deposition. The metal materials may include one or more of tungsten and copper.

A lead-out-electrode metal layer 22 is formed by, for example, physical vapor deposition. The lead-out-electrode metal layer 22 is disposed on surfaces of the first lead-out electrodes 20 and the second lead-out electrodes 21, and extends to an upper surface of the third dielectric layer 19. The lead-out electrode metal layer 22 includes, but is not limited to, copper, aluminum, gold or metal silicide.

Figure 17:
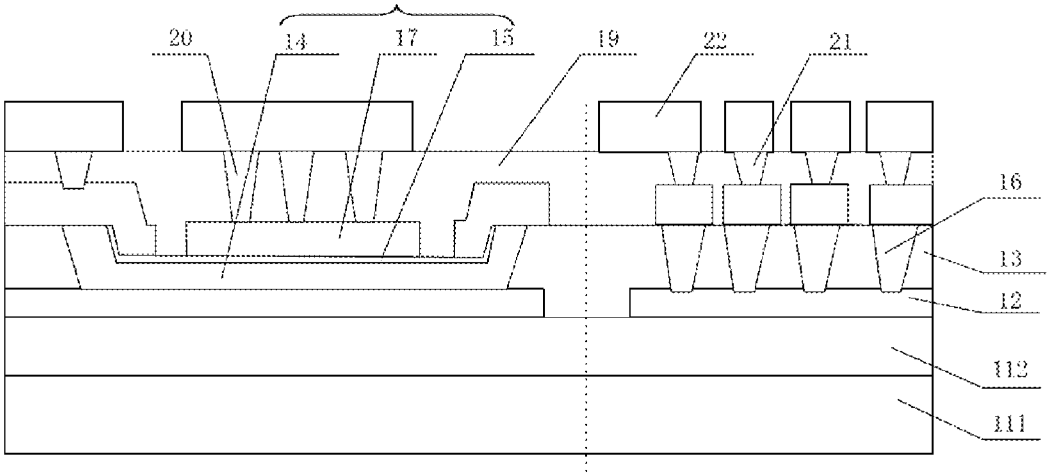
Figure 18:
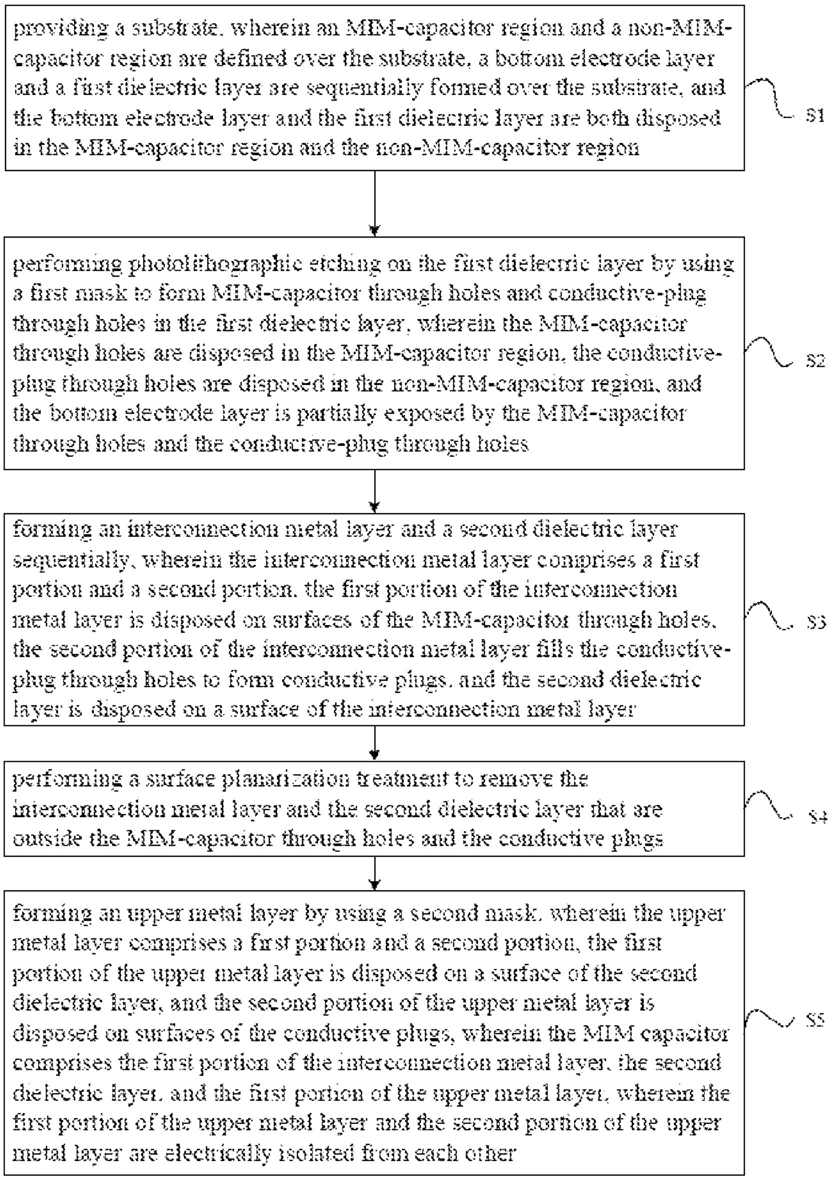
FIG. 18 shows a flowchart of a method for manufacturing a semiconductor MIM capacitor device according to an embodiment of the present disclosure.

With the use of a fourth mask, photolithographic etching is performed on the lead-out electrode metal layer 22, so that a first portion of the lead-out electrode metal layer 22 in the MIM-capacitor region and a second portion of the lead-out electrode metal layer 22 in the non-MIM-capacitor region are electrically isolated from each other. That is, the first lead-out electrodes 20 and the second lead-out electrodes 21 are not connected. The first lead-out electrodes 20 are electrically connected to each other, while the second lead-out electrodes 21 can be electrically isolated from each other as needed. The structure obtained after this step is shown in FIG. 17. Certainly, in other embodiments, the step of forming the lead-out electrodes may be performed after the first lead-out-electrode through holes and the second lead-out-electrode through holes are formed by etching. The lead-out electrodes may be formed by using a mask to cover the region where no lead-out metal needs to be formed, so as to perform metal deposition only on specific regions (such a requirement is relatively demanding for deposition equipment and results in more difficulty). For example, metal filling is performed only in the first lead-out-electrode through holes and the second lead-out-electrode through holes.

The present disclosure further provides a semiconductor device with an MIM capacitor. The semiconductor device can be manufactured according to any of the aforementioned methods; thus, the aforementioned contents can be cited herein in their entirety. Certainly, the semiconductor device can also be manufactured by other methods. As shown in FIG. 17, the semiconductor device includes a substrate 11, a bottom electrode layer 12, an interconnection metal layer 14, a first dielectric layer 13, a second dielectric layer 15, and an upper metal layer 17. An MIM-capacitor region and a non-MIM-capacitor region are defined on the substrate 11. The MIM-capacitor region and the non-MIM-capacitor region are arranged adjacent to each other, or spaced apart from each other. The bottom electrode layer 12 is disposed on an upper surface of the substrate 11. A material of the bottom electrode layer 12 includes, but is not limited to, copper, aluminum or metal silicide. The first dielectric layer 13 is disposed on an upper surface of the bottom electrode layer 12, through holes of MIM-capacitor 131 disposed in the MIM-capacitor region and conductive-plug through holes 132 disposed in the non-MIM-capacitor region are formed in the first dielectric layer 13, so that the bottom electrode layer 12 is partially exposed by the through holes of MIM-capacitor 131 and by the conductive-plug through holes 132. The interconnection metal layer 14 is disposed on surfaces of the through holes of MIM-capacitor 131 and fills the conductive-plug through holes 132 to form conductive plugs 16. The number of the conductive plugs 16 may be one or more. When there are multiple conductive plugs 16, they are distributed at intervals. The second dielectric layer 15 is disposed on upper surfaces of the interconnection metal layer 14. An upper metal layer 17 includes a first portion disposed on a surface of the second dielectric layer 15, and a second portion disposed on the surfaces of the conductive plugs 16. The MIM capacitor 18 is formed by the interconnection metal layer 14 disposed in the through holes of MIM-capacitor 131, the second dielectric layer 15, and the first portion of the upper metal layer 17. The first portion of upper metal layer 17, which is part of the MIM capacitor 18, and the second portion of the upper metal layers 17 on the surfaces of the conductive plugs 16 are electrically isolated from each other. The interconnection metal layer 14 and the conductive plugs 16 are electrically isolated from each other.

The substrate 11 may be a single-layer structure, or may be a multi-layer structure as shown in this embodiment, including, for example, a base layer 111 and an interlayer dielectric layer 112 disposed on the surface of the base layer 111. The base layer 111 includes, but is not limited to, a semiconductor substrate such as a silicon substrate, a germanium substrate, a silicon-germanium substrate, a sapphire substrate, a silicon-on-insulator (SOI) substrate, etc. The interlayer dielectric layer 112 includes, but is not limited to, a silicon oxide layer, a silicon nitride layers, a silicon oxynitride layer or other insulating layers.

As an example, the interconnection metal layer 14 includes, but is not limited to, at least one of titanium, titanium nitride, copper, and tungsten. The material of the upper metal layer 17 may be the same as or different from the material of the lower metal layer. Such material includes, but not limited to, at least one of titanium, titanium nitride, copper, and tungsten.

As an example, the second dielectric layer 15 includes, but is not limited to, at least one of silicon oxide, silicon nitride, and a combination thereof, and a high-K dielectric material can also be used, such as aluminum oxide, tantalum oxide, yttrium oxide, hafnium silicate oxide, hafnium oxide, lanthanum oxide, or zirconium oxide.

In one embodiment, the conductive plugs 16 extend into the bottom electrode layer 12 to ensure electrical connection between the conductive plugs 16 and the bottom electrode layer 12.

In one embodiment, the semiconductor device further includes first lead-out electrodes 20 and second lead-out electrodes 21 spaced apart from each other. The first lead-out electrodes 20 are electrically connected to the MIM capacitor 18. The first lead-out electrodes 20 can be plural and are electrically connected to each other. The second lead-out electrodes 21 are electrically connected to the conductive plugs 16. The number of the second lead-out electrodes 21 is generally consistent with the number of the conductive plugs 16, and the second lead-out electrodes 21 correspond to the conductive plugs 16 one to one.

For more detailed description of the semiconductor device, please refer to the foregoing content.

In summary, the present disclosure the present disclosure optimizes the process by adopting through holes to provide stepwise structures. During the surface planarization treatment performed on the interconnection metal layer, conductive metals at the bottom will not be removed and can be used as the MIM capacitor's lower plate, the upper metal layer is used as the upper plate, and the two along with the dielectric layer between the lower metal layer and the upper metal layer, form an MIM capacitor. Compared with the current technique, the present disclosure can effectively reduce mask usage, which helps to reduce the cost. In addition, using only two masks means only two photolithography processes are required, which improves the production efficiency of the photolithography equipment. At the same time, the photolithography processes are simplified, so that the difficulty of the overall process is overcome, which helps to improve the product yield. For the semiconductor device manufactured according to the present disclosure, only a single dielectric layer needs to be etched when the conductive-plug through holes in the non-MIM-capacitor region are formed by etching, which helps to ensure that the conductive-plug through holes are indeed through holes, so that generation of voids after the subsequent filling with the interconnect metal material can be prevented, which helps to improve the electrical performance of the device. Therefore, the present disclosure effectively overcomes various shortcomings in the current technique and has high industrial value.

The above-mentioned embodiments merely illustrate the principles and effects of the present disclosure, and are not intended to limit the scope of the present disclosure. Anyone skilled in the art can modify or change the above embodiments without departing from the spirit and scope of the present disclosure. Therefore, all equivalent modifications or changes made by those with ordinary skills in the art without departing from the spirit and technical concept disclosed in the present disclosure should still be protected by the claims of the present disclosure.

What is claimed is:

1. A method for manufacturing a semiconductor metal-insulator-metal (MIM) capacitor device, comprising:

providing a substrate, wherein an MIM-capacitor region and a non-MIM-capacitor region are defined on the substrate;

forming a bottom electrode layer and a first dielectric layer sequentially on the substrate, wherein the bottom electrode layer and the first dielectric layer are both disposed in the MIM-capacitor region and the non-MIM-capacitor region;

performing patterning by applying a first mask in the first dielectric layer to form a through hole of MIM-capacitor and through holes for conductive plugs, wherein the through hole of MIM-capacitor is disposed in the MIM-capacitor region, wherein the through holes for conductive plugs are disposed in the non-MIM-capacitor region, wherein and the bottom electrode layer is partially exposed by the through hole of MIM-capacitor and the through holes for conductive plugs;

forming an interconnection metal layer and a second dielectric layer sequentially, wherein the interconnection metal layer comprises a first portion and a second portion, wherein the first portion of the interconnection metal layer is disposed on a surface of the through hole of MIM-capacitor and comprises a first recess region recessed towards the through hole of MIM-capacitor, wherein the second portion of the interconnection metal layer fills the through holes for conductive plugs to form conductive plugs, wherein the second dielectric layer is disposed on a surface of the interconnection metal layer; and wherein the interconnection metal layer and the second dielectric layer partially fill the through hole of MIM-capacitor, such that the second dielectric layer comprises a second recess region recessed towards the first recess region; wherein the first recess region of the interconnection metal layer and the second recess region of the second dielectric layer are formed to have trapezoidal cross-sections, with their openings larger than their respective bottom surfaces;

performing a surface planarization treatment to remove the interconnection metal layer and the second dielectric layer that are outside the through hole of MIM-capacitor and the through holes for the conductive plugs; and after the surface planarization treatment, forming an upper metal layer and patterning the upper metal layer by using a second mask, wherein, after the patterning, the upper metal layer comprises a first portion and a second portion, wherein the first portion of the upper metal layer is disposed on a surface of the second dielectric layer, and the second portion of the upper metal layer is disposed on surfaces of the conductive plugs, wherein the first portion of the interconnection metal layer, the second dielectric layer, and the first portion of the upper metal layer constitute the MIM capacitor, and wherein the first portion of the upper metal layer and the second portion of the upper metal layer are electrically isolated from each other;

wherein after two mask processes, the first portion of the interconnection metal layer serves as a recessed lower plate of the MIM capacitor, and the first portion of the upper metal layer serves as an upper plate of the MIM capacitor.

2. The method according to claim 1, wherein a number of the through holes for the conductive plugs is at least two, and wherein the through holes for the conductive plugs are arranged in parallel and spaced apart.

3. The method according to claim 1, wherein the first dielectric layer comprises at least one of silicon oxide, silicon nitride, and silicon oxynitride, the second dielectric layer comprises at least one of silicon oxide, silicon nitride, aluminum oxide, tantalum oxide, yttrium oxide, hafnium silicate oxide, hafnium oxide, lanthanum oxide, and zirconium oxide, and the interconnection metal layer comprises at least one of titanium, titanium nitride, copper, and tungsten.

4. The method according to claim 1, wherein a thickness of the first dielectric layer is larger than a thickness of the second dielectric layer, wherein the through holes for the conductive plugs and the through holes of MIM-capacitor both have top openings larger than bottom openings in same holes, wherein at least one of the through holes for the conductive plugs has the top opening smaller than the top opening of the through hole of MIM-capacitor.

5. The method according to claim 1, wherein forming the upper metal layer and the patterning of the upper metal layer by using the second mask comprises: forming the upper metal material layer after the surface planarization treatment, wherein the upper metal material layer is disposed on both the MIM-capacitor region and the non-MIM-capacitor region; and performing the patterning with the second mask on the upper metal material layer to form the first portion of the upper metal layer on the surface of the second dielectric layer and the second portion of the upper metal layer on the surfaces of the conductive plugs, respectively.

6. The method according to claim 1, wherein after forming the upper metal layer, the method further comprises: forming a plurality of lead-out electrodes, wherein the plurality of lead-out electrodes is electrically connected with the first portion of the upper metal layer on the surface of the second dielectric layer, and the second portion of the upper metal layer on the surfaces of the conductive plugs, respectively.

7. The method according to claim 6, wherein forming the plurality of lead-out electrodes comprises: forming a third dielectric layer covering both the MIM-capacitor region and the non-MIM-capacitor region;

performing patterning on the third dielectric layer by applying a third mask to form first through holes of the lead-out electrode and second through holes of the lead-out electrode spaced apart from each other in the third dielectric layer, wherein the first through holes of lead-out electrode partially expose the first portion of the upper metal layer and the second through holes of lead-out electrode partially expose the second portion of the upper metal layer;

performing metal filling in the first through holes of the lead-out electrode and the second through holes of the lead-out electrode to form first lead-out electrodes and second lead-out electrodes, respectively; forming a lead-out electrode metal layer disposed on surfaces of the first lead-out electrodes and the second lead-out electrodes, wherein the lead-out electrode metal layer extends to the upper surface of the third dielectric layer;

and performing patterning on the lead-out electrode metal layer by applying a fourth mask, so that a first portion of the lead-out electrode metal layer in the MIM-capacitor region and a second portion of the lead-out electrode metal layer in the non-MIM-capacitor region are electrically isolated from each other.

8. The method according to claim 1, wherein an upper surface of the second recess region is formed to be lower than an upper surface of the first dielectric layer, and the surface planarization treatment stops at the upper surface of the first dielectric layer.

9. The method according to claim 1, wherein before the surface planarization treatment, a first distance between an uppermost surface and a bottommost surface of the second dielectric layer is less than a second distance between an uppermost surface and a bottommost surface of the interconnection metal layer, and the second distance is larger than a thickness of the first dielectric layer.

10. The method according to claim 1, wherein the through holes for the conductive-plugs extend into the bottom electrode layer.

* * * * *